(12) United States Patent
Hou et al.

(10) Patent No.: US 7,017,132 B2
(45) Date of Patent: Mar. 21, 2006

(54) METHODOLOGY TO OPTIMIZE HIERARCHICAL CLOCK SKEW BY CLOCK DELAY COMPENSATION

(75) Inventors: Cliff Hou, Taipei (TW); Chia-Lin Cheng, Tao-Yuan (TW); Lee-Chung Lu, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 120 days.

(21) Appl. No.: 10/706,380

(22) Filed: Nov. 12, 2003

(65) Prior Publication Data

US 2005/0102643 A1    May 12, 2005

(51) Int. Cl.
    *G06F 17/50* (2006.01)
(52) U.S. Cl. .............................. 716/6; 716/10; 716/18
(58) Field of Classification Search .................... 716/2, 716/5–7, 10, 12, 18
    See application file for complete search history.

(56) References Cited

U.S. PATENT DOCUMENTS

| | | | | |
|---|---|---|---|---|
| 5,686,845 | A | 11/1997 | Erdal et al. | 326/93 |
| 5,864,487 | A | 1/1999 | Merryman et al. | 364/491 |
| 6,020,774 | A | 2/2000 | Chiu et al. | 327/295 |
| 6,053,950 | A | 4/2000 | Shinagawa | 716/2 |
| 6,311,314 | B1 | 10/2001 | McBride | 716/6 |
| 6,473,890 | B1 | 10/2002 | Yasui et al. | 716/10 |
| 6,609,241 | B1 * | 8/2003 | Yonemori | 716/12 |
| 6,651,224 | B1 * | 11/2003 | Sano et al. | 716/2 |
| 6,751,786 | B1 * | 6/2004 | Teng et al. | 716/18 |

OTHER PUBLICATIONS

"Clock Generation and Distribution for the First IA-64 Microprocessor," Tam et al. IEEE Jrnl of Solid-State Circuits, pp. 1545-1552, Nov. 2000, vol. 35, No. 11, ISSN: 0018-9200.

"Performance Optimization of VLSI Interconnect Layout," Cong et al., The Jrnl of VLSI Integration, vol. 21, Nos. 1&2, Nov. 1996, pp. 1-99.

"An Algorithm for Zero-Skew Clock Tree Routing with Buffer Insertion," Chen et al., Proceeding—European Design and Test Conf., pp. 1-22, 1996.

"Physical Design CAD in Deep Sub-micron Era," Mitsuhashi et al., Proceedings of the European Design Automation Conf. w/EURO-VHDL '96, Geneva, Switzerland, IEEE Comp. Soc. Press, CA, pp. 350-355, ISBN: 0-8186-7573-X.

"Wire Segmenting for Improved Buffer Insertion," Alper et al., Proc. of the 34th Annual ACM/IEEE Design Automation Conf., 1997, ACM Press, NY, USA, pp. 588-593, ISBN: 0-89791-920-3.

"Repeater Block Planning under Simultaneous Delay and Transition Time Constraints," Sarkar et al., Proc. 2001 Euro. Design, Auto. & Test Conf., Mar. 2001, pp. 540-544.

* cited by examiner

*Primary Examiner*—Paul Dinh

(57) ABSTRACT

A method for synthesizing a clock distribution system within an integrated circuit for compensating for clock skew within a global or top level clock distribution network begins with allocating at least one delaying circuit within each of functional circuits of the integrated circuit. An intra-functional clock distribution network is fabricated within each of the functional circuits. Once the intra-functional clock distribution network is fabricated, an inter-functional clock distribution network is constructed between each of the functional circuits. A clock skew for the inter-functional clock distribution network is determined. The clock skew is then compensated by inserting the delaying circuit at a terminal of the inter-function clock distribution network where each of the functional circuits is connected to the inter-functional clock distribution network.

18 Claims, 5 Drawing Sheets

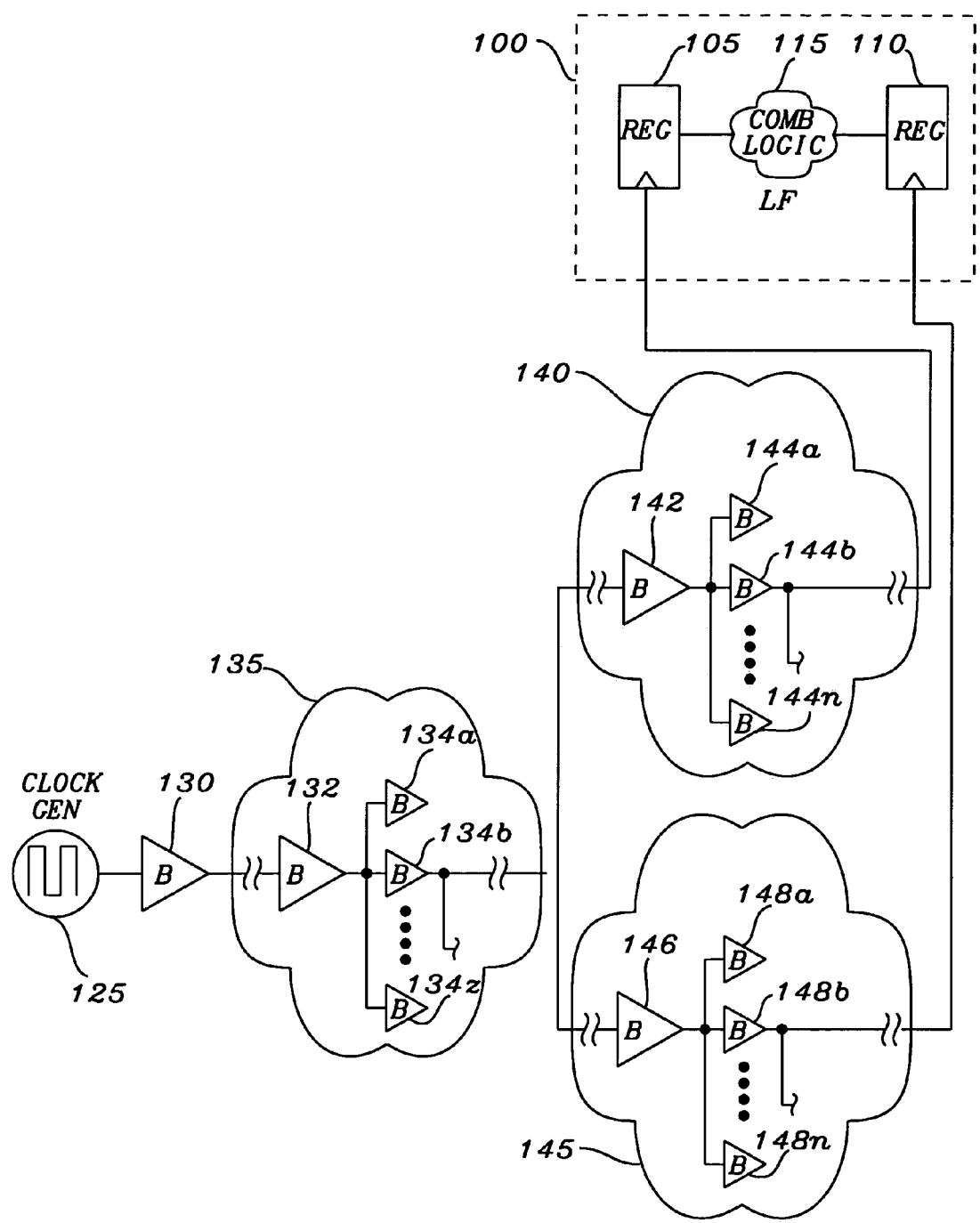
FIG. 1 — Prior Art

METHODOLOGY TO OPTIMIZE HIERARCHICAL CLOCK SKEW BY CLOCK DELAY COMPENSATION

BACKGROUND OF THE INVENTION

1. Field of the Invention

The present invention relates generally to methods and apparatus for the design, partition, and placement of microelectronic integrated circuits. More specifically, the present invention is related methods and apparatus for the design and construction of a hierarchical clock distribution system within microelectronic integrated circuits. Even more particularly the present invention relates to methods and apparatus for compensating for clock skew within the clock distribution system between functional circuit blocks of the integrated circuits.

2. Description of Related Art

Electronic Design Automation (EDA) tools and methods facilitate the design, partition, and placement of microelectronic integrated circuits on a semiconductor substrate. Generally transistors are formed into primitive circuits that perform digital logic functions such as AND, OR, NAND, NOR, etc. The primitive circuits are then organized into macro circuits such as multiplexers, adders, multipliers, decoders, etc., which in turn are organized as functional blocks. In a hierarchical design, the functions of the integrated circuit design are allocated space on the semiconductor substrate. Each of the individual functions is then partitioned into the various macro circuits which are often predesigned and placed in a library of the EDA system. When the individual functional designs are completed, the global design of the whole integrated circuit is then completed to interconnect the individual functional blocks.

In a synchronous logic design, a common timing signal or clock is employed to insure that the circuitry functions correctly. The clock is distributed to each of the registers or latches within the functions and ideally arrives at each of the latches simultaneously during operation. In reality this is not true. There are differences in the distribution of the clock which causes variation in the arrival of the clock at each of the registers or latches. This variation is referred commonly as "clock skew".

Refer now to FIG. 1 for a discussion of the structure of a clock distribution system for an integrated circuit of the prior art and the contributing factors to the clock skew. The primitive logic circuits are configured to form a combinational logic function 115. The registers 110 and 120 provide the memory elements for groups of the sequential logic functions 100. The sequential logic functions 100 are partitioned and organized to form the individual macro-function logic blocks. The macro-function logic blocks are arranged and placed physically on the semiconductor substrate.

A clock generator 125 provides the clock timing signal used to provide the synchronization of the data being transferred to and transferred from the registers. The clock timing signal is transferred through a clock distribution system or clock tree from the clock generator 125 to the registers 110. The clock distribution system or clock tree is a series of buffer circuits placed in an ever widening network or subtrees 135, 140, and 145. Each buffer is generally a driver circuit constructed to provide an increment of delay to the clock timing signal and sufficient drive for the number of buffers in the next layer of buffers.

In the example of the clock distribution system, as shown, the clock timing signal is received from the clock signal generator 125 by the buffer 130. The buffer 130 forms a first layer of the clock distribution system or clock tree. The output of the buffer 130 is connected to the second layer of buffers 132. Each of the buffers of the second layer of buffers 132 is in turn connected to a group of buffers of the third layer of buffers 134a, . . . , 134z. The first, second, and third layers of buffers form the global or top level of the clock distribution system and provide the interconnections to distribute the clock timing signal to the macro-function logic blocks. The global or top layer clock distribution system may provide a balanced common subtree 135.

The clock distribution system is further distributed through the clock subtrees 140 and 145 to the sequential logic functions 100. In the example as shown the output of the buffer 134b is connected to the buffers 142 and 146. The outputs of the buffers 142 and 146 are connected respectively to a group of buffers 144a, . . . , 144n and 148a, . . . , 148n within each of the macro-function logic blocks. The output of the subtree 140 provides the clock timing signal to the register 105 and the output of the subtree 145 provides the clock timing signal to the register 110.

The clock skew for the clock distribution network is determined by the load that results from the number of buffers of a following layer being driven by an output of a buffer and by the physical wiring segments required to connect the output of the buffer to the input of the buffers of the following layer. It is not possible to either totally balance the number of buffers or the amount of wiring segment used in creating the clock distribution. Additionally, the structure of the two subtrees 140 and 145 may differ in the number of layers of buffers. Thus, the arrival times of the timing clock signals at the registers 105 and 110 may differ. These differences create the differences in arrival times of the clock timing signal or clock skew. In the present hierarchical design methods, the portion of the clock distribution system, within the macro-function logic blocks, are designed initially when the macro-function logic blocks are designed. Normally, the physical sizes or the macro-function logic blocks permit the structure of the clock distribution system to be well balanced to minimize the clock skew within the macro-function logic blocks. When the global interconnection of the clock distribution system are implemented, the distances between the macro-function logic blocks vary significantly. The clock skew at the global level can thus differ at the global or top level significantly more than within the macro-function logic blocks.

"Clock Generation and Distribution for the First IA-64 Microprocessor," Tam et al. IEEE Journal of Solid-State Circuits, pp. 1545–1552, November 2000, Volume: 35 Issue: 11, ISSN: 0018-9200 describes clock distribution with an active distributed deskewing technique. The technique is capable of compensating skews caused by within-die process variations that are becoming a significant factor of the clock design. A multilevel skew budget and local clock timing methodology are used to enable a high-performance design by providing support for intentional clock skew injection and time borrowing. A test access port interface is provided to the deskew architecture with the incorporation of the on-die-clock-shrink for post-silicon timing debug.

"Performance Optimization of VLSI Interconnect Layout," Cong et al. The Journal of VLSI Integration, Vol. 21, Nos. 1&2, November 1996, pp. 1–94 presents a comprehensive survey of existing techniques for interconnect optimization during the VLSI physical design process, with emphasis on recent studies on interconnect design and optimization for high-performance VLSI circuit design under the deep submicron fabrication technologies.

"An Algorithm for Zero-Skew Clock Tree Routing with Buffer Insertion," Chen et al. Proceeding—European Design and Test Conf., pages 652–657, 1996 presents multi-stage zero skew clock tree construction for minimizing clock phase delay and wire-length. Chen et al. simultaneously performs clock tree routing and buffer insertion. A clustering-based algorithm, which uses shortest delay as the cost function, is described.

"Physical Design CAD in Deep Sub-micron Era," Mitsuhashi et al., Proceedings of the European Design Automation Conference with EURO-VHDL'96, 1996, Geneva, Switzerland, IEEE Computer Society Press, Los Alamitos, Calif., pp. 350–355, ISBN:0-8186-7573-X describes timing optimization and power minimization methods using the concept are discussed in detail.

"Wire segmenting for improved buffer insertion," Alpert et al., Proceedings of the 34th Annual ACM/IEEE Design Automation Conference, 1997, ACM Press, New York, N.Y., USA, pp. 588–593 ISBN:0-89791-920-3 presents buffer insertion, which seeks to place buffers on the wires of a signal net to minimize delay. Alpert et al. studies the problem of finding the correct number of segments for each wire in the routing tree. Too few segments yields sub-par solutions, but too many segments can lead to excessive run times and memory loads.

"Repeater Block Planning under Simultaneous Delay and Transition Time Constraints,' Sarkar et al. Proceedings 2001 European Design, Automation and Test Conference, March 2001, pp. 540–544 describes a solution to the problem of repeater block planning under both delay and signal transition time constraints for a given floor plan.

U.S. Pat. No. 6,311,314 (McBride) describes a system and method for evaluating the loading of a clock driver. The method evaluates each node within a net list file to determine: (1) whether that node is an output node for a clock driver; and (2) for clock driver nodes, whether that node is within loading specification for the particular clock driver circuit.

U.S. Pat. No. 6,053,950 (Shinagawa) teaches a layout method for a clock tree in a clock signal distribution circuit. In the layout of the clock tree, a standard clock tree is prepared having a route buffer, a plurality of intermediate stage buffer cells and a plurality of last stage buffer cells connected in a hierarchical configuration. All of the clock lines have an equal length. If there is no set of flip-flops in a target integrated circuit corresponding to a set of last stage buffer cells, the set of last stage buffer cells are removed as a whole provided there is not other last stage buffer cells connected to a flip-flop.

U.S. Pat. No. 6,020,774 (Chiu, et al.) demonstrates a gated clock tree synthesis (CTS) method for the purpose of synthesizing a gate array logic circuit to allow optimal topological arrangement of the gate array on the logic circuit.

U.S. Pat. No. 5,864,487 (Merryman, et al.) illustrates a method and apparatus for identifying gated clocks within a circuit design using a standard optimization tool. The gated clock signals may be identified by identifying which of the number of raw clock signals is coupled, through combinational logic, to a selected one of the number of state devices. This results in an identified raw clock signal. A number of enable signals coupled through combinational logic to the selected one of the number of state devices is identified and results in an identified enable signal. The gated clock signals are then uniquely determined by the particular combination of the identified raw clock signal and the identified enable signal.

U.S. Pat. No. 5,686,845 (Erdal, et al.) describes a hierarchical clock distribution system and method. The method of producing a hierarchical clock distribution system for the circuit includes determining clock skews between the clock driver and the sub-blocks respectively. Delay buffers are selected from a predetermined set of delay buffers having the same physical size and different delays, with the delay buffers being selected to provide equal clock skews between the clock driver and the distribution systems respectively. Each delay buffer includes a delay line, and a number of loading elements that are connected to the delay line, with the number of loading elements being selected to provide the required clock delay for the respective sub-block.

SUMMARY OF THE INVENTION

An object of this invention is to provide a method and apparatus for synthesizing a clock distribution system within an integrated circuit.

Another object of this invention is to provide a method and apparatus for compensating for clock skew within a global or top level clock distribution network.

To accomplish at least one of these objects and other objects, a method for synthesizing a clock distribution circuit within an integrated circuit device composed of a plurality of functional circuits begins with allocating at least one delaying circuit within each of the functional circuits. An intra-functional clock distribution network is fabricated within each of the functional circuits. Once the intra-functional clock distribution network is fabricated, an inter-functional clock distribution network is constructed between each of the functional circuits.

The method continues by determining a clock skew for the inter-functional clock distribution network. The clock skew is then compensated by inserting the delaying circuit at a terminal of the inter-function clock distribution network where each of the functional circuits is connected to the inter-functional clock distribution network. The compensation for the inter-function clock skew is accomplished by determining a clock skew factor for one selected functional circuit connected to one selected terminal of the inter-functional clock distribution network. The delaying circuit is then adjusted within the one selected functional circuit to cancel out the clock skew factor.

The delaying circuit includes a plurality of delaying buffer circuits, each delaying buffer circuit having a first increment of delay. The delaying circuit also includes a plurality of interconnecting wiring segments placed between each of the plurality of delaying buffer circuits. Each of the interconnecting wiring segments has a second increment of delay. The adjustment of the delaying circuit is accomplished by connecting a first quantity of the delaying buffer circuits with a second quantity of the plurality of interconnecting wiring segments such that a sum of the first increment of delay of the first quantity of the delaying buffer circuits and the second quantity of delay of the interconnecting wiring segments is equal to the clock skew factor.

BRIEF DESCRIPTION OF THE DRAWINGS

FIG. 1 is a schematic diagram of a clock distribution system of an integrated circuit of the prior art.

DETAILED DESCRIPTION OF THE INVENTION

In an integrated circuit of this invention, the clock distribution circuit has a network of inter-functional buffer circuits connected to distribute a clock timing signal from a clock generator to each macro-function circuit of the integrated circuit device. Within each macro-function circuit, a network of intra-functional buffer circuits is connected to distribute the clock timing signal to the register circuits of each synchronous functional circuit. An adjustable delay block is placed at the boundary of each of the macro-function circuits. During the physical design layout of the integrated circuit device, the intra-functional clock distribution network is designed. Once the global functions have been arranged on the semiconductor substrate and the intra-functional clock distribution network designed, the inter-functional clock distribution network is constructed. The differences of the delays for branch of the inter-functional distribution network is calculated to determine the clock skew for each of the branches. The adjustable delay blocks are then modified to account for the skew of each of the branches of the inter-functional or as commonly termed the top level clock distribution network.

Figure 2A:
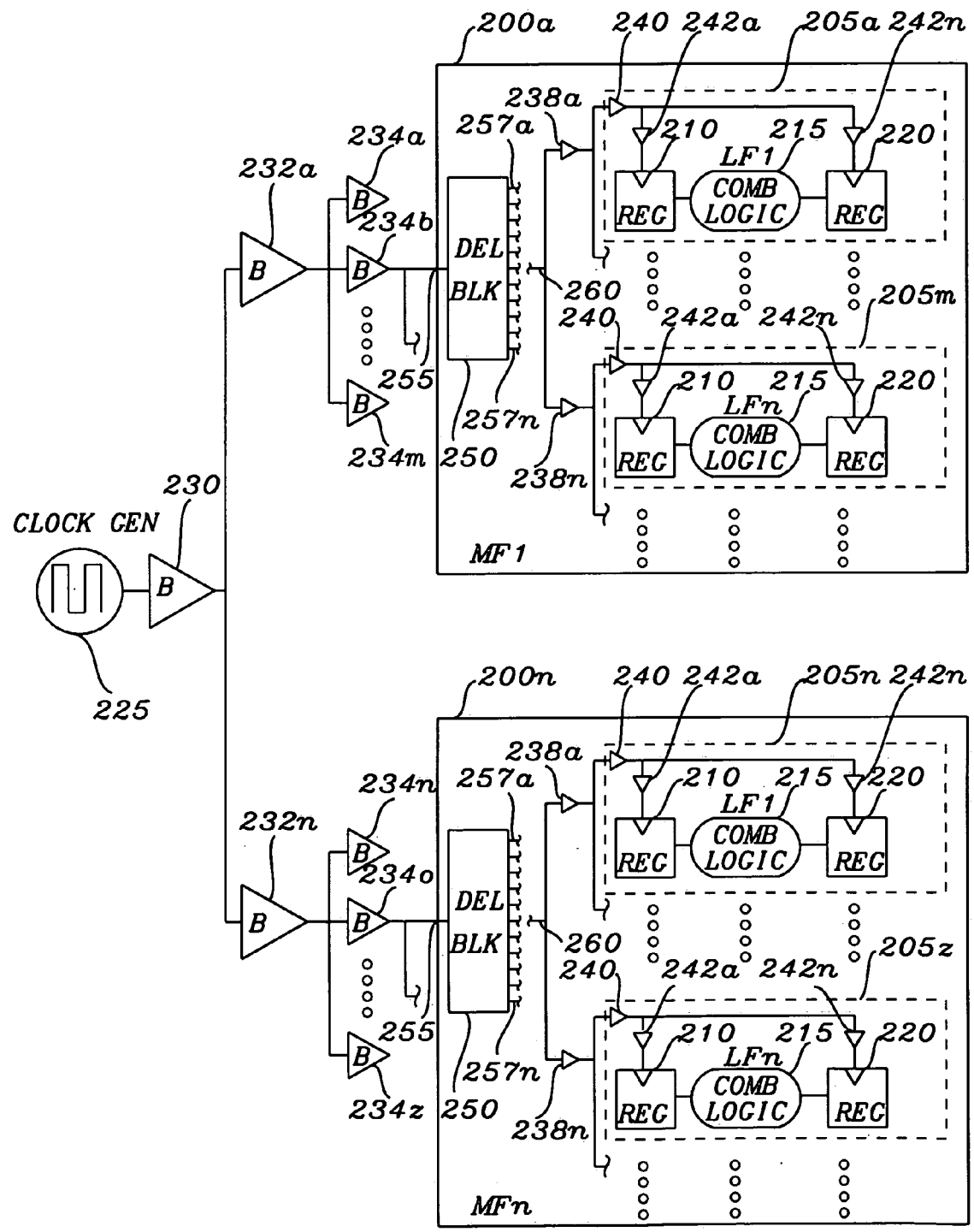
FIG. 2a is a schematic diagram of a clock distribution system of an integrated circuit of this invention.

For a more detailed discussion of the structure of a clock distribution system for an integrated circuit of this invention, refer now to FIG. 2a. The primitive logic circuits are configured to form a combinational logic function 215. The registers 210 and 220 provide the memory elements for the sequential logic functions 205a, ..., 205z. The sequential logic functions 205a, ..., 205z are partitioned and organized to form the macro-function logic blocks 200a, ..., 200n. The macro-function logic blocks 200a, ..., 200n are arranged and placed physically on the semiconductor substrate.

A clock generator 225 provides the clock timing signal used to provide the synchronization of the data being transferred to and transferred from the registers 210 and 220. The clock timing signal is transferred through a clock distribution system or clock tree from the clock generator 225 to the registers 210 and 220. The clock distribution system or clock tree is a series of buffer circuits placed in an ever widening network. Each buffer is generally a driver circuit constructed to provide an increment of delay to the clock timing signal and sufficient drive for the number of buffers in the next layer of buffers.

In the example of the clock distribution system, as shown, the clock timing signal is received from the clock signal generator 225 by the buffer 230. The buffer 230 forms a first layer of the clock distribution system or clock tree. The output of the buffer 230 is connected to the second layer of buffers 232a, ..., 232n. Each of the buffers of the second layer of buffers 232a, ..., 232n is in turn connected to a group of buffers of the third layer of buffers 234a, ..., 234z. The first, second, and third layers of buffers form the global or top level of the clock distribution system and provide the inter-functional connections to distribute the clock timing signal to the macro-function logic blocks 200a, ..., 200n.

At the boundaries of the macro-function logic blocks 200a, ..., 200n, an area of delay cells are allocated to for a delay circuit block 250. The delay circuit block 250 is placed at the interface of the macro-function logic blocks 200a, ..., 200n at the terminal 255 of the connections from the global clock distribution system. The outputs 257a, ..., 257n of the delay circuit block are selectively connected to the input terminal 260 of the intra-functional clock distribution system of the macro-function logic blocks 200a, ..., 200n. The selection of the outputs 257a, ..., 257n of the delay blocks 250 is determined by the clock skew from the connections of the inter-functional clock distribution system.

The intra-functional clock distribution system further distributes clock timing signal within the macro-function logic blocks 200a, ..., 200n. In the example as shown the output of the delay block 250 is connected to a group of buffers 238a, ..., 238n within each of the macro-function logic blocks 200a, ..., 200n. The output of each of the buffers 238a, ..., 238n is connected to a group of buffers 240 within each of the sequential logic function, which is connected to the buffers 242a, ..., 242n. The buffers 242a, ..., 242n are the final driving buffers that deliver the clock timing signal to the registers 210 and 220.

As described above, the clock skew for the clock distribution network is determined by the load that results from the number of buffers of a following layer being driven by an output of a buffer and by the physical wiring segments required to connect the output of the buffer to the input of the buffers of the following layer. It is not possible to either totally balance the number of buffers or the amount of wiring segments used in creating the clock distribution. These differences create the differences in arrival times of the clock timing signal or clock skew. Once the intra-functional clock distribution system and the global or top level distribution system are configured, the clock skew for each is determined. The delay block 250 is then adjusted to compensate for the clock skew of the inter-functional clock distribution system. The output terminal 257a, ..., 257n is selected to provide the compensating delay for the clock skew.

Figure 2B:
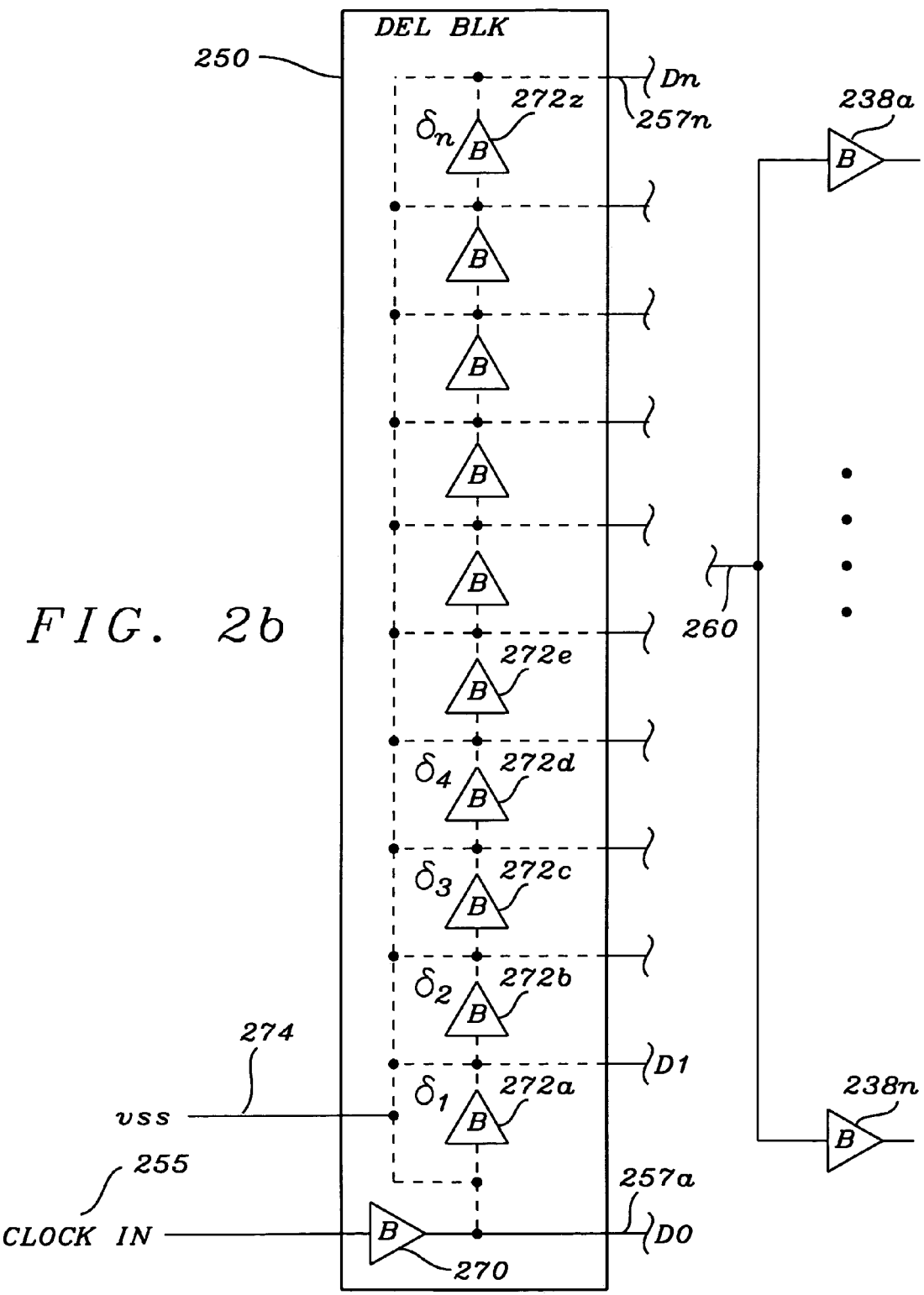
FIG. 2b is a schematic diagram a delaying circuit of the clock distribution system of an integrated circuit of this invention.

Refer now to FIG. 2b for a discussion of an example of a structure of the delay block 250. The terminal 255 of the inter-functional clock distribution system is connected to the input buffer 270 of the delay block 250. The delay buffers 272a, ..., 272z are designed to provide specific delay increments and maybe modified during design if other delay increments are desired. The delay buffers 272a, ..., 272z are serially connected output to input to form a delay chain. The output of each of the delay buffers 272a, ..., 272z are connected for distribution of the delayed clock timing signal to the output terminals 257a, ..., 257n. The adjustment of the delay block 250 entails the selection of the delay buffers 272a, ..., 272z to choose the appropriate delay increments for the delay buffers 272a, ..., 272z and then the choosing of the number of delay buffers 272a, ..., 272z (which terminal outputs 257a, ..., 257n to select) to provide the desired clock skew adjustment. Further, the compensation delay is modified by placing additional wiring segments between the delay buffers 272a, ..., 272z to more finely modify the compensating delay. Those delay buffers 272a, ..., 272z not selected for inclusion in the serially connected buffers to provide the compensation delay to reduce or eliminate the clock skew have their inputs connected to a substrate biasing voltage source ($V_{ss}$) 274.

Figure 2C:
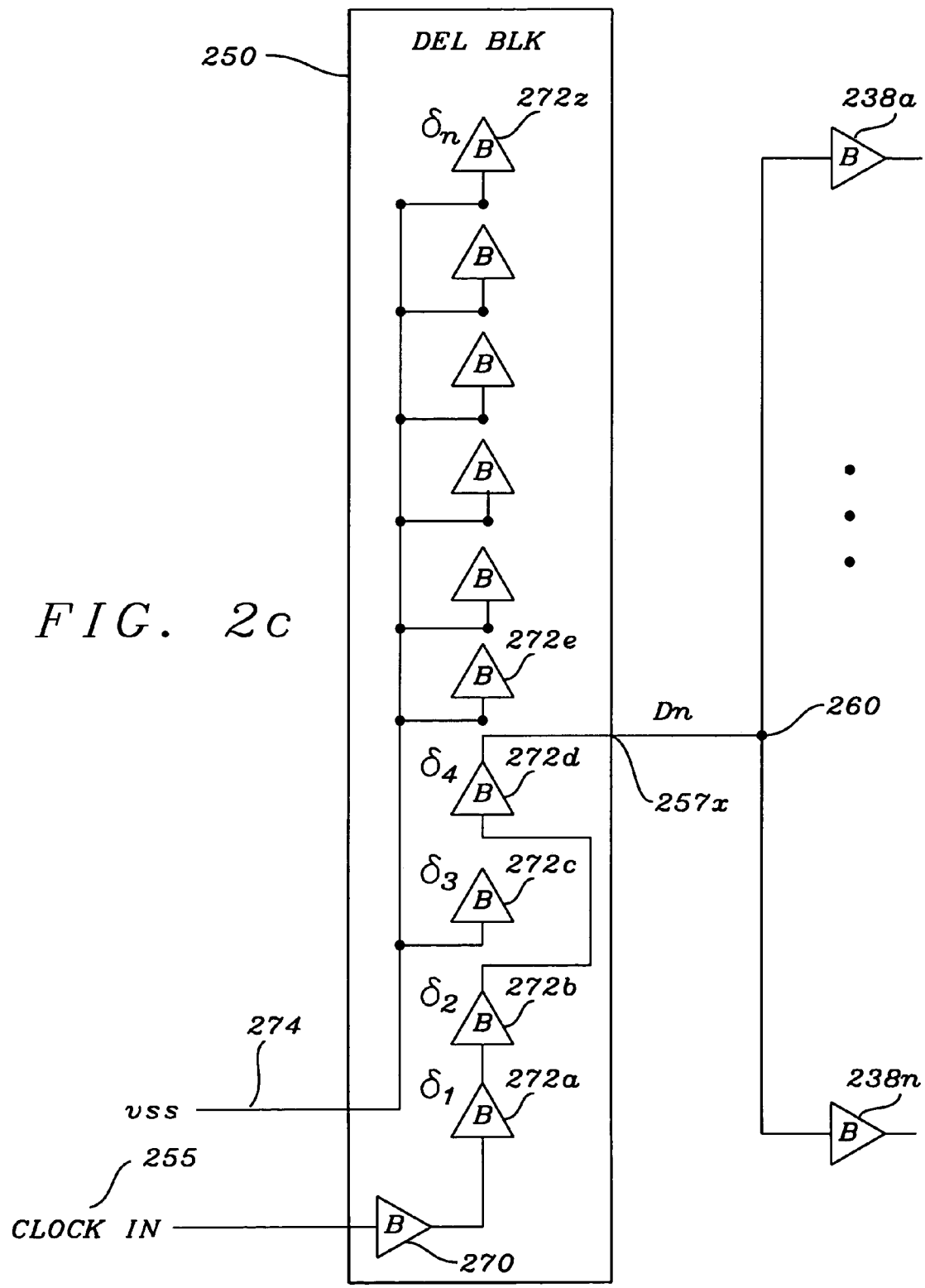
FIG. 2c is a schematic diagram illustrating an implementation of the delaying circuit of the clock distribution system of an integrated circuit of this invention.

Refer now to FIG. 2c for a configuration of the clock delay block 250. The delays of the delay buffers 272a, ..., 272z designed to be set at incremental delay times $\delta_1, \delta_2, \delta_3$, and $\delta_4$. If the clock skew between two clock timing signals is determined to sum of the delays $\delta_1, \delta_2$, and $\delta_4$, then the delay buffers 272a, 272b, and 272d are serially connected together. The output 257x of the delay buffer 272d is connected to the input terminal 260 of the intrafunctional clock buffers 238a, ..., 238n. The remaining delay buffers 272c, 272, ..., 272z not connected have their inputs connected to the substrate biasing voltage source ($V_{ss}$) 274.

Figure 3:
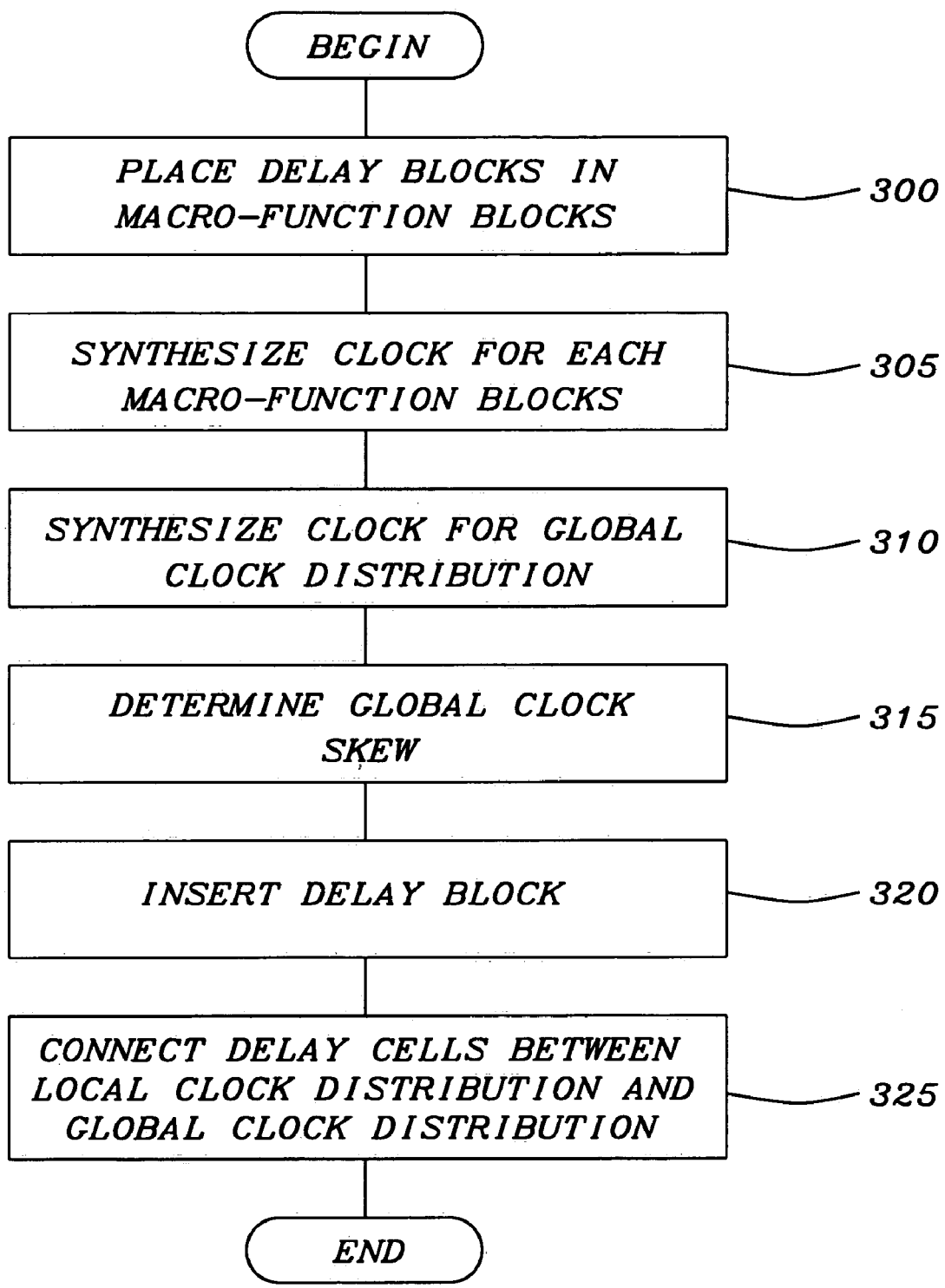
FIG. 3 is a process diagram for the method for design of a clock distribution system within an integrated circuit of this invention.

The method for the creation of the clock distribution system within the design procedure of an integrated circuit that is being placed on a semiconductor substrate is shown in FIG. 3. The delay block 250 of FIG. 2a of each of the macro-function logic blocks 200a, . . . , 200n are allocated and placed (block 300) within the macro-function logic blocks 200a, . . . , 200n. The intra-functional clock distribution circuit for each of the macro-function logic blocks 200a, . . . , 200n is then synthesized (block 305). After the macro-function logic blocks 200a, . . . , 200n are placed in their allocated locations on the substrate, the inter-functional global clock distribution circuit is synthesized (block 310) to provide a distribution path for the clock timing signal to each of the macro-function logic blocks 200a, . . . , 200n. The clock timing skew of inter-functional global clock distribution circuit is then determined (block 315). The delay blocks are then modified (block 320) as described in FIG. 2b and inserted (block 325) between the inter-functional global clock distribution circuit and the intra-functional clock distribution circuit to compensate for and thus eliminate clock skew for each branch of the inter-function global clock distribution circuit. The standard EDA system tools are then exercised to complete the placement, wiring, and checking of the design to complete the integrated circuit for manufacturing.

While this invention has been particularly shown and described with reference to the preferred embodiments thereof, it will be understood by those skilled in the art that various changes in form and details may be made without departing from the spirit and scope of the invention.

What is claimed is:

1. A method for synthesizing a clock distribution circuit within an integrated circuit device, said device comprised of a plurality of functional circuits and placed on a substrate, said method comprising the steps of:
    allocating at least one delaying circuit within each of said functional circuits;
    fabricating an intra-functional clock distribution network within each of the functional circuits;
    fabricating an inter-functional clock distribution network between each of the functional circuits;
    determining a clock skew for the inter-functional clock distribution network; and
    compensating for the clock of said inter-functional clock distribution network by inserting said delaying circuit at a terminal of said inter-function clock distribution network wherein each of said functional circuits is connected to said inter-functional clock distribution network and said delaying circuit includes a plurality of delaying buffer circuits that are serially connected by a plurality of interconnecting wiring segments, each delaying buffer circuit having a first increment of delay and said interconnecting wiring segments having a second increment of delay.

2. The method of claim 1 wherein compensating for said clock skew of said inter-functional clock distribution network comprises the steps of:
    determining a clock skew factor for one selected functional circuit connected to one selected terminal of said inter-functional clock distribution network; and
    adjusting the delaying circuit within said one selected functional circuit to cancel out said clock skew factor.

3. The method of claim 1 wherein adjusting said delaying circuit comprises the step of connecting a first quantity of said delaying buffer circuits with a second quantity of said plurality of interconnecting wiring segments such that a sum of the first increment of delay of said first quantity of the delaying buffer circuits and the second quantity of delay of said interconnecting wiring segments is equal to the clock skew factor.

4. An apparatus for synthesizing a clock distribution circuit within an integrated circuit device, said device comprised of a plurality of functional circuits and placed on a substrate, said apparatus comprising:
    means for allocating at least one delaying circuit within each of said functional circuits;
    means for fabricating an intra-functional clock distribution network within each of the functional circuits;
    means for fabricating an inter-functional clock distribution network between each of the functional circuits;
    means for determining a clock skew for the inter-functional clock distribution network; and
    means for compensating for the clock of said inter-functional clock distribution network by inserting said delaying circuit at a terminal of said inter-function clock distribution network wherein each of said functional circuits is connected to said inter-functional clock distribution network and said delaying circuit includes a plurality of delaying buffer circuits that are serially connected by a plurality of interconnecting wiring segments, each delaying buffer circuit having a first increment of delay and said interconnecting wiring segments having a second increment of delay.

5. The apparatus of claim 4 wherein means for compensating for said clock skew of said inter-functional clock distribution network comprises:
    means for determining a dock skew factor for one selected functional circuit connected to one selected terminal of said inter-functional clock distribution network; and
    means for adjusting the delaying circuit within said one selected functional circuit to cancel out said clock skew factor.

6. The apparatus of claim 4 wherein the means for adjusting said delaying circuit comprises means for connecting a first quantity of said delaying buffer circuits with a second quantity of said plurality of interconnecting wiring segments such that a sum of the first increment of delay of said first quantity of the delaying buffer circuits and the second quantity of delay of said interconnecting wiring segments is equal to the clock skew factor.

7. An apparatus for synthesizing a clock distribution circuit within an integrated circuit device, said device comprised of a plurality of functional circuits and placed on a substrate, said apparatus comprising means for executing the steps of:
    allocating at least one delaying circuit within each of said functional circuits;
    fabricating an intra-functional clock distribution network within each of the functional circuits;
    fabricating an inter-functional dock distribution network between each of the functional circuits;
    determining a clock skew for the inter-functional clock distribution network; and
    compensating for the clock of said inter-functional clock distribution network by inserting said delaying circuit at a terminal of said inter-function clock distribution network wherein each of said functional circuits is connected to said inter-functional clock distribution network and said delaying circuit includes a plurality of delaying buffer circuits that are serially connected by a plurality of interconnecting wiring segments, each delaying buffer circuit having a first increment of delay and said interconnecting wiring segments having a second increment of delay.

8. The apparatus of claim 7 wherein compensating for said clock skew of said inter-functional clock distribution network comprises the steps of:
    determining a clock skew factor for one selected functional circuit connected to one selected terminal of said inter-functional clock distribution network; and adjusting the delaying circuit within said one selected functional circuit to cancel out said dock skew factor.

9. The apparatus of claim 7 wherein adjusting said delaying circuit comprises the step of connecting a first quantity of said delaying buffer circuits with a second quantity of said plurality of interconnecting wiring segments such that a sum of the first increment of delay of said first quantity of the delaying buffer circuits and the second quantity of delay of said interconnecting wiring segments is equal to the clock skew factor.

10. A clock distribution circuit within an integrated circuit device, said device comprised of a plurality of functional circuits and placed on a substrate, said clock distribution circuit comprising:
   at least one delaying circuit placed within each of said functional circuits;
   an intra-functional clock distribution network within each of the functional circuits; and
   an inter-functional clock distribution network between each of the functional circuits;
   wherein a clock skew for the inter-functional clock distribution network is compensated by inserting said delaying circuit at a terminal of said inter-function dock distribution network wherein each of said functional circuits is connected to said inter-functional clock distribution network and said delaying circuit includes a plurality of delaying buffer circuits that are serially connected by a plurality of interconnecting wiring segments, each delaying buffer circuit having a first increment of delay and said interconnecting wiring segments having a second increment of delay.

11. The clock distribution circuit of claim 9 wherein compensating for said clock skew of said inter-functional clock distribution network comprises the steps of:
   determining a clock skew factor for one selected functional circuit connected to one selected terminal of said inter-functional clock distribution network; and
   adjusting the delaying circuit within said one selected functional circuit to cancel out said clock skew factor.

12. The clock distribution circuit of claim 10 wherein adjusting said delaying circuit comprises the step of connecting a first quantity of said delaying buffer circuits with a second quantity of said plurality of interconnecting wiring segments such that a sum of the first increment of delay of said first quantity of the delaying buffer circuits and the second quantity of delay of said interconnecting wiring segments is equal to the clock skew factor.

13. A integrated circuit synthesizing apparatus for synthesizing an integrated circuit device, said device comprised of a plurality of functional circuits and placed on a substrate, said integrated circuit synthesizing apparatus executing the steps of:
   synthesizing a clock distribution circuit within said integrated circuit device, said synthesizing comprising the steps of:
   allocating at least one delaying circuit within each of said functional circuits;
   fabricating an intra-functional clock distribution network within each of the functional circuits;
   fabricating an inter-functional clock distribution network between each of the functional circuits;
   determining a clock skew for the inter-functional clock distribution network; and
   compensating for the clock of said inter-functional clock distribution network by inserting said delaying circuit at a terminal of said inter-function clock distribution network wherein each of said functional circuits is connected to said inter-functional clock distribution network and said delaying circuit includes a plurality of delaying buffer circuits that are serially connected by a plurality of interconnecting wiring segments, each delaying buffer circuit having a first increment of delay and said interconnecting wiring segments having a second increment of delay.

14. The integrated circuit synthesizing apparatus of claim 13 wherein compensating for said clock skew of said inter-functional clock distribution network comprises the steps of:
   determining a clock skew factor for one selected functional circuit connected to one selected terminal of said inter-functional clock distribution network; and
   adjusting the delaying circuit within said one selected functional circuit to cancel out said clock skew factor.

15. The integrated circuit synthesizing apparatus of claim 13 wherein adjusting said delaying circuit comprises the step of connecting a first quantity of said delaying buffer circuits with a second quantity of said plurality of interconnecting wiring segments such that a sum of the first increment of delay of said first quantity of the delaying buffer circuits and the second quantity of delay of said interconnecting wiring segments is equal to the clock skew factor.

16. A medium for retaining a computer program which, when executed on a computing system, executes a process for synthesizing a dock distribution circuit within an integrated circuit device, said device comprised of a plurality of functional circuits and placed on a substrate, said process comprising the steps of:
   allocating at least one delaying circuit within each of said functional circuits;
   fabricating an intra-functional clock distribution network within each of the functional circuits;
   fabricating an inter-functional dock distribution network between each of the functional circuits;
   determining a clock skew for the inter-functional clock distribution network; and
   compensating for the clock of said inter-functional clock distribution network by inserting said delaying circuit at a terminal of said inter-function clock distribution network wherein each of said functional circuits is connected to said inter-functional clock distribution network and said delaying circuit includes a plurality of delaying buffer circuits that are serially connected by a plurality of interconnecting wiring segments, each delaying buffer circuit having a first increment of delay and said interconnecting wiring segments having a second increment of delay.

17. The medium of claim 15 wherein compensating for said clock skew of said inter-functional clock distribution network comprises the steps of:
   determining a clock skew factor for one selected functional circuit connected to one selected terminal of said inter-functional dock distribution network; and
   adjusting the delaying circuit within said one selected functional circuit to cancel out said clock skew factor.

18. The medium of claim 16 wherein adjusting said delaying circuit comprises the step of connecting a first quantity of said delaying buffer circuits with a second quantity of said plurality of interconnecting wiring segments such that a sum of the first increment of delay of said first quantity of the delaying buffer circuits and the second quantity of delay of said interconnecting wiring segments is equal to the clock skew factor.

* * * * *

UNITED STATES PATENT AND TRADEMARK OFFICE
CERTIFICATE OF CORRECTION

| | | |
|---|---|---|
| PATENT NO. | : 7,017,132 B2 | Page 1 of 1 |
| APPLICATION NO. | : 10/706380 | |
| DATED | : March 21, 2006 | |
| INVENTOR(S) | : Cliff Hou et al. | |

It is certified that error appears in the above-identified patent and that said Letters Patent is hereby corrected as shown below:

Column 8, line 26 of claim 5, "dock" should be changed to --clock--.

Column 8, line 48 of claim 7, "dock" should be changed to --clock--.

Column 9, line 2 of claim 8, "dock" should be changed to --clock--.

Column 9, line 22 of claim 10, "dock" should be changed to --clock--.

Column 10, line 25 and 33 of claim 16, "dock" should be changed to --clock--.

Column 10, line 54 of claim 17, "dock" should be changed to --clock--.

Signed and Sealed this

Twenty-third Day of January, 2007

JON W. DUDAS
*Director of the United States Patent and Trademark Office*